(12) United States Patent
Schroeder et al.

(10) Patent No.: US 8,164,347 B2
(45) Date of Patent: Apr. 24, 2012

(54) CONTINUOUS SERIES ARC GENERATOR

(75) Inventors: Jeremy D. Schroeder, North Liberty, IA (US); Ryan J. Moffitt, Coralville, IA (US); Brian Patrick Grove, Cedar Rapids, IA (US)

(73) Assignee: Schneider Electric USA, Inc., Palatine, IL (US)

( * ) Notice: Subject to any disclaimer, the term of this patent is extended or adjusted under 35 U.S.C. 154(b) by 779 days.

(21) Appl. No.: 12/255,384

(22) Filed: Oct. 21, 2008

(65) Prior Publication Data
US 2010/0097074 A1 Apr. 22, 2010

(51) Int. Cl.
*H01H 31/02* (2006.01)
*G01R 31/327* (2006.01)
(52) U.S. Cl. .......... 324/555; 324/424; 324/536; 361/42
(58) Field of Classification Search .................. 324/424, 324/536, 555; 361/42
See application file for complete search history.

(56) References Cited

U.S. PATENT DOCUMENTS

| | | | |
|---|---|---|---|
| 5,834,940 A * | 11/1998 | Brooks et al. | 324/424 |
| 5,969,920 A | 10/1999 | Mackenzie | |
| 6,876,204 B2 | 4/2005 | Smith | |
| 7,242,291 B2 | 7/2007 | Nicolls et al. | |
| 7,439,744 B2 * | 10/2008 | Gass et al. | 324/424 |
| 2006/0171085 A1 * | 8/2006 | Keating | 361/42 |
| 2008/0100305 A1 | 5/2008 | Gass et al. | |

OTHER PUBLICATIONS

Public Use of Schneider Electric CAFI demonstrator (2006); (4 pages).
Public Use of Siemens Combination Type AFCI Demo Unit; (Apr. 2008); (1 page).

\* cited by examiner

*Primary Examiner* — Timothy J Dole

(57) ABSTRACT

An arc fault demonstrator device for testing the efficacy of an arc fault interrupter (AFI) circuit breaker. The device includes a motor that moves a movable electrode relative to a stationary electrode under microprocessor control. A relay switches the electrodes connection between an arc voltage measurement circuit and an electrode close circuit. When current is applied to the electrodes, the measurement circuit provides voltage measurements to the microprocessor, which instructs the motor to move the electrodes closer or apart. When the arc voltage is below a low threshold, the electrodes are moved apart until the arc voltage exceeds a medium threshold. When the arc voltage exceeds a high threshold, the electrodes are moved closer until the arc voltage falls below the medium threshold. A switch switches between the AFI circuit breaker or a conventional circuit breaker to confirm that the AFI breaker will trip upon detection of the arc whereas the conventional breaker will not.

18 Claims, 4 Drawing Sheets

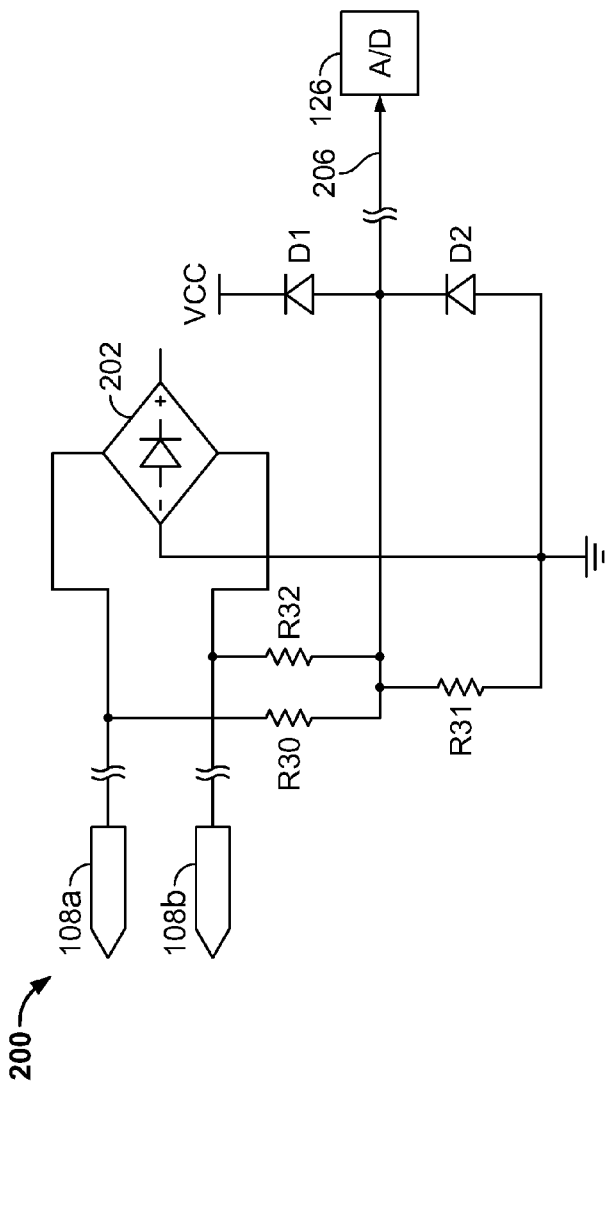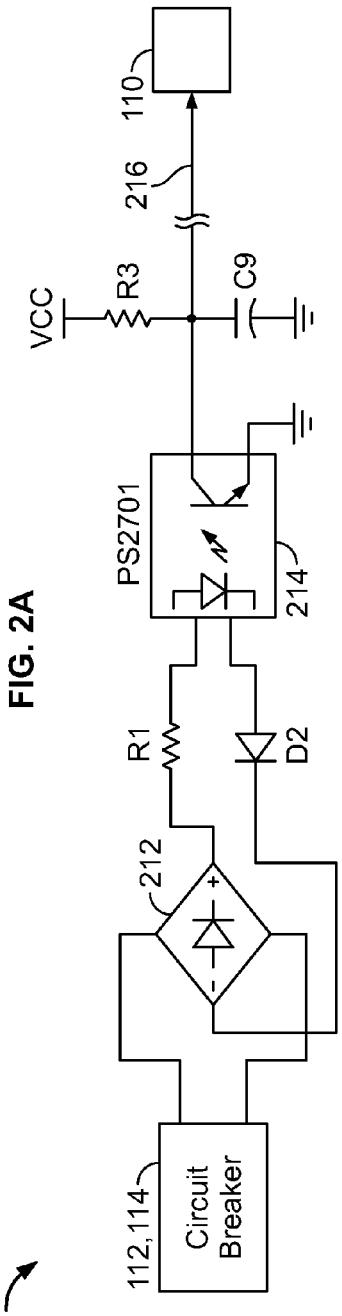
FIG. 2A
FIG. 2B

CONTINUOUS SERIES ARC GENERATOR

FIELD OF THE INVENTION

Aspects of the present invention relate generally to energy efficiency solutions, and in particular, to a plug-and-play energy efficiency solution and automatic data-push methods for the same.

BACKGROUND OF THE INVENTION

Igniting and maintaining a series electrical arc between two electrodes is difficult to do manually. Precise and rapid movement of the electrodes is needed to sustain the requisite distance and voltage between the electrodes to maintain the series arc. Existing methods for generating series arcs require manual adjustment between the electrodes. The arcs tend to startle the operator, making it difficult for the operator to maintain a reliable, consistent ignition of a series arc or to maintain a sustained series arc. In demonstrator or tester devices designed to demonstrate the efficacy of series arc fault circuit interrupter (AFCIs) circuit breakers versus traditional thermal or thermal-magnetic circuit breakers, it is desired to maintain a series arc between the electrodes for a sustained period of time. Typically, these devices include a switch that switches which circuit breaker is protecting the load. If the demonstration or test goes as planned, once the AFCI circuit breaker is switched to connect to the circuit, the AFCI circuit breaker should trip, interrupting the flow of current to the load and protecting the load against the potentially dangerous effects caused by series arcs, such as an electrical fire.

What is needed is a device that automatically generates and sustains a continuous series arc for an extended period of time. Aspects and embodiments disclosed herein are directed to addressing/solving these and other needs.

SUMMARY OF THE INVENTION

According to an aspect of the present disclosure, a device for repeatedly demonstrating or testing a series arc fault detection circuit breaker is disclosed that sustains a series arc by moving an electrode under control of a motor toward or away from a stationary electrode. A microprocessor monitors the voltage across the electrodes via an analog-to-digital converter. When the electrodes are in contact with one another, the voltage across them is zero. If the electrodes are not in contact with one another and no series arc is present, the voltage across the electrodes equals the source voltage. An arc requires some minimum voltage to ignite and maintain. An algorithm executed by the microprocessor is based on the instantaneous value of the line voltage (e.g., 120V). To adjust the distance between the electrodes, the microprocessor controls the motor that urges the electrodes toward or away from one another. The voltage across the electrodes is not allowed to drop near the minimum arc voltage or to rise to a value near the source voltage.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 2A is a circuit diagram of an electrode voltage measurement circuit, which provides an input voltage signal representing the voltage across the electrodes;

FIG. 2B is a circuit diagram of a circuit breaker status circuit, which provides to the microcontroller an indication of a status of the circuit breaker;

DETAILED DESCRIPTION OF THE ILLUSTRATED EMBODIMENTS

Although the invention will be described in connection with certain aspects and/or embodiments, it will be understood that the invention is not limited to those particular aspects and/or embodiments. On the contrary, the invention is intended to cover all alternatives, modifications, and equivalent arrangements as may be included within the spirit and scope of the invention as defined by the appended claims.

Figure 1:
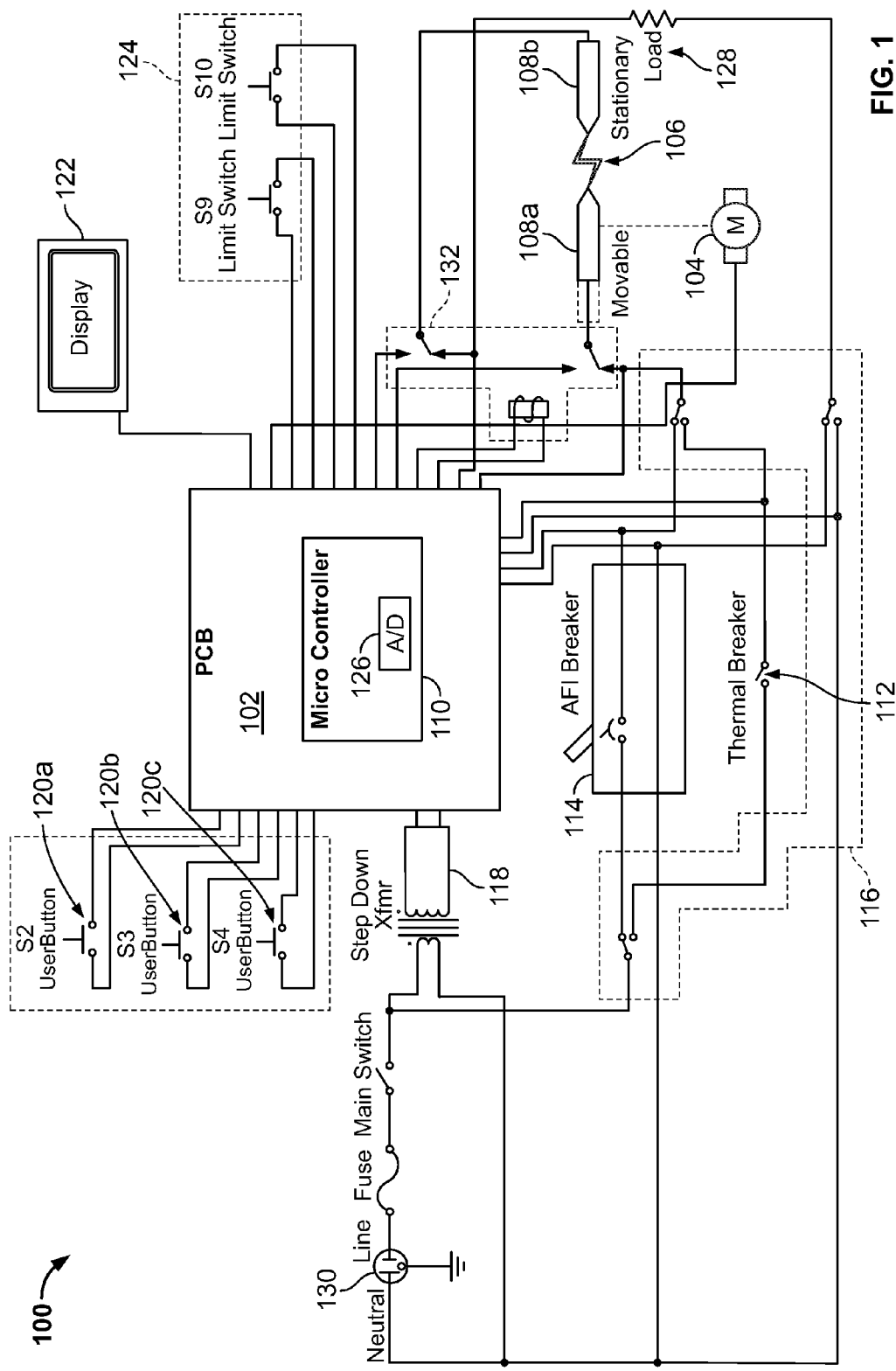
FIG. 1 is a functional block diagram of a device for demonstrating or testing a series arc fault detection circuit breaker.

FIG. 1 is a functional block diagram of a device 100 for demonstrating or testing an arc fault detection circuit breaker 114, also known as an Arc Fault Interrupter (AFI) circuit breaker, by generating and maintaining a continuous series arc across a gap between two electrodes 108. The AFI circuit breaker 114 is capable of detecting and tripping on at least a series arc fault, but can also be capable of detecting and tripping on a parallel arc fault. AFI circuit breakers capable of detecting both series and parallel arc faults are sometimes referred to as "combination" arc fault interrupters (CAFI) and are available from the assignee of the present disclosure, Square D Company, based in Palatine, Ill. An AFI circuit breaker includes a microprocessor that detects arc faults via an algorithm that analyzes characteristics of the current and/or voltage sensed on the line. The device 100, which may variously be called a demonstrator or a tester, includes a printed circuit board (PCB) 102 having a microcontroller 110, a first electrode 108a that is movable and a second electrode 108b that is stationary, and a stepper motor 104 (sometimes also called a step motor), which, under control of an algorithm 300 (FIG. 3) executed by the microcontroller 110, causes the movable electrode 108a to be urged or moved toward or away from the stationary electrode 108b. When a gap is present between the electrodes 108, an electrical arc 106 can exist when current is passed through the electrodes 108. One or both of the electrodes 108 can be preferably composed of graphite, which creates a brighter arc compared to, for example, copper, resulting in a more compelling visual effect.

The microcontroller 110 includes an analog-to-digital (A/D) converter 126, which can alternately be a separate component from the microcontroller 110 on the PCB 102. At least the following components are connected to the PCB 102: the stepper motor 104, an optional video display 122, such as a liquid crystal display (LCD) or a light emitting diode (LED) display, limit switches 124, a double-pole, double-throw (DPDT) relay 132, a three-pole double-throw (3PDT) toggle switch 116, a step-down transformer 118, a conventional thermal or thermal-magnetic circuit breaker 112 (hereafter non-AFI circuit breaker), the AFI circuit breaker 114 capable of detecting series arc faults, and buttons 120*a-c*. The operation of these components will be described in more detail below. The device 100 is powered from a 120V ac (alternating current) power supply via a plug connector 130. A conventional power supply (not shown), converts the 120V ac to a suitable dc (direct current) voltage supply level for the components on the PCB 102 and the external components to the PCB 102, including the stepper motor 104 and the relay 132.

The 3PDT toggle switch 116 switches the electrical connection of the circuit across which a load 128 is connected between the non-AFI circuit breaker 112 and the AFI circuit breaker 114. The toggle switch 116 can be thrown to disconnect the non-AFI circuit breaker 112 and to connect the AFI circuit breaker 114 to verify that the AFI circuit breaker 114 will trip in response to detecting the series arc across the electrodes 108. If the AFI circuit breaker 114 does not trip in response to the toggle switch 116 connecting the AFI circuit breaker 114 to the load 128 being protected, the operator of the device 100 can deem the demonstration or test a failure. In demonstration mode, the device 100 can be utilized to show how a non-AFI breaker 112 will not trip upon the occurrence of a low-voltage, series arc fault because such faults are usually far below the breaker's handle rating. However, when the toggle switch 116 is thrown to connect the AFI circuit breaker 114, the AFI circuit breaker 114 should trip to demonstrate its efficacy at detecting arc faults.

The relay 132 switches the connection of the electrodes 108 from a non-arcing mode to an arcing mode. The relay 132 normally places the device 100 into the non-arcing mode, and a voltage must be maintained across the relay 132 to cause it to switch the device into the arcing mode. As shown in FIG. 1, the relay 132 is actively set to the arcing mode and electrically couples the electrodes 108 to the line current. When the relay 132 is switched to its default inactive position, the connection of the electrodes 108 is placed in the non-arcing mode for detecting when the electrodes are touching one another. An electrode close circuit 220 for determining when the electrodes are touching one another in the non-arcing mode is described in more detail in connection with FIG. 2C below.

The video display 122 displays status information about the device 100. For example, the video display 122 displays the status of the breakers 112, 114 (e.g., on, off, tripped).

The limit switches 124 toggle when the electrodes 108*a,b* have moved too far apart from one another or have been forced too close to one another. The microcontroller 110 monitors the status of these limit switches 124 while engaging the stepper motor 104 to ensure that the distance between the electrodes 108 is within an acceptable range. If one of the limits is exceeded, the microcontroller 110 instructs the stepper motor 104 to stop. The microcontroller 110 can update a register or other memory location with a value representing a minimum or maximum distance threshold for the electrodes 108.

The buttons 120*a-c* are accessible from an exterior of the device, and correspond to a start, stop, and reset operation of the device 100. When the start button 120*a* is pressed, the microcontroller 110 initiates the algorithm 300 to begin generating a continuous series arc fault between the electrodes 108. When the stop button 120*b* is pressed, the microcontroller 110 instructs the relay 132 to toggle, removing current to the electrodes 108 and stopping stepper motor 104. When the reset button 120*c* is pressed, the demonstrator 100 is reset.

The stepper motor 104 causes the movable electrode 108*a* to move in incremental steps. Each rotational step of the motor described in Table 1 below causes the movable electrode 108*a* to move laterally about 2 µm. The microcontroller 110 controls the operation of the stepper motor 104, instructing the stepper motor 104 how many steps to turn the motor.

FIG. 2A is a circuit diagram of an electrode voltage measurement circuit 200, which provides to the A/D converter 126 an input voltage signal 206 representing the voltage across the electrodes 108. When an electrical arc 106 is present between the electrodes 108, the voltage across them represents the voltage of the arc. A bridge rectifier 202 rectifies the voltage, which is divided to a range that is safe and acceptable for the A/D converter 126 by a voltage divider network comprising R30, R31, and R32. Protection diodes D1 and D2 provide protection for the A/D converter 126. When the relay 132 is in the position shown in FIG. 1 (arcing mode), the electrode voltage measurement circuit 200 is active, and the A/D converter 126 receives voltage measurement readings from the electrodes 108 via the electrode voltage measurement circuit 200. When the electrodes 108 are touching one another, the input voltage signal 206 is zero.

FIG. 2B is a circuit diagram of a circuit breaker status circuit 210, which provides to the microcontroller 110 an indication of whether a circuit breaker 112, 114 is on or off. Although only one circuit 210 is shown, this circuit is duplicated for each circuit breaker in the device 100. In this example, because there are two circuit breakers 112 and 114, there would be two status circuits 210, one for each breaker. The status circuit 210 includes a rectifier 212 for rectifying the voltage (if present) across the circuit breaker 112, 114. An optocoupler 214, which electrically isolates the circuit breaker 112, 114 from the sensitive digital components on the PCB 102, is turned on when the circuit breaker 112, 114 is on. When the optocoupler 214 turns on, a signal 216 representing the "on" status of the circuit breaker 112, 114 is provided as a logic level low to an input of the microcontroller 110. When the optocoupler 214 is off, the signal 216 indicates that the circuit breaker 112, 114 is in an off state, which can also indicate that the circuit breaker 112, 114 is in a tripped state. The microcontroller 110 can cause the status of the circuit breaker (e.g., "On" or "Off") to be displayed on the display 122. Accordingly, the operator can readily confirm that the circuit breaker 112, 114 under test or demonstration is actually on or off before running the test or demonstration. Because the circuit breaker 112, 114 is typically housed within a housing of the device 100, it would be potentially dangerous for the operator to open up the housing to determine the on/off status of the circuit breaker 112, 114 under test or demonstration.

Figure 2C:
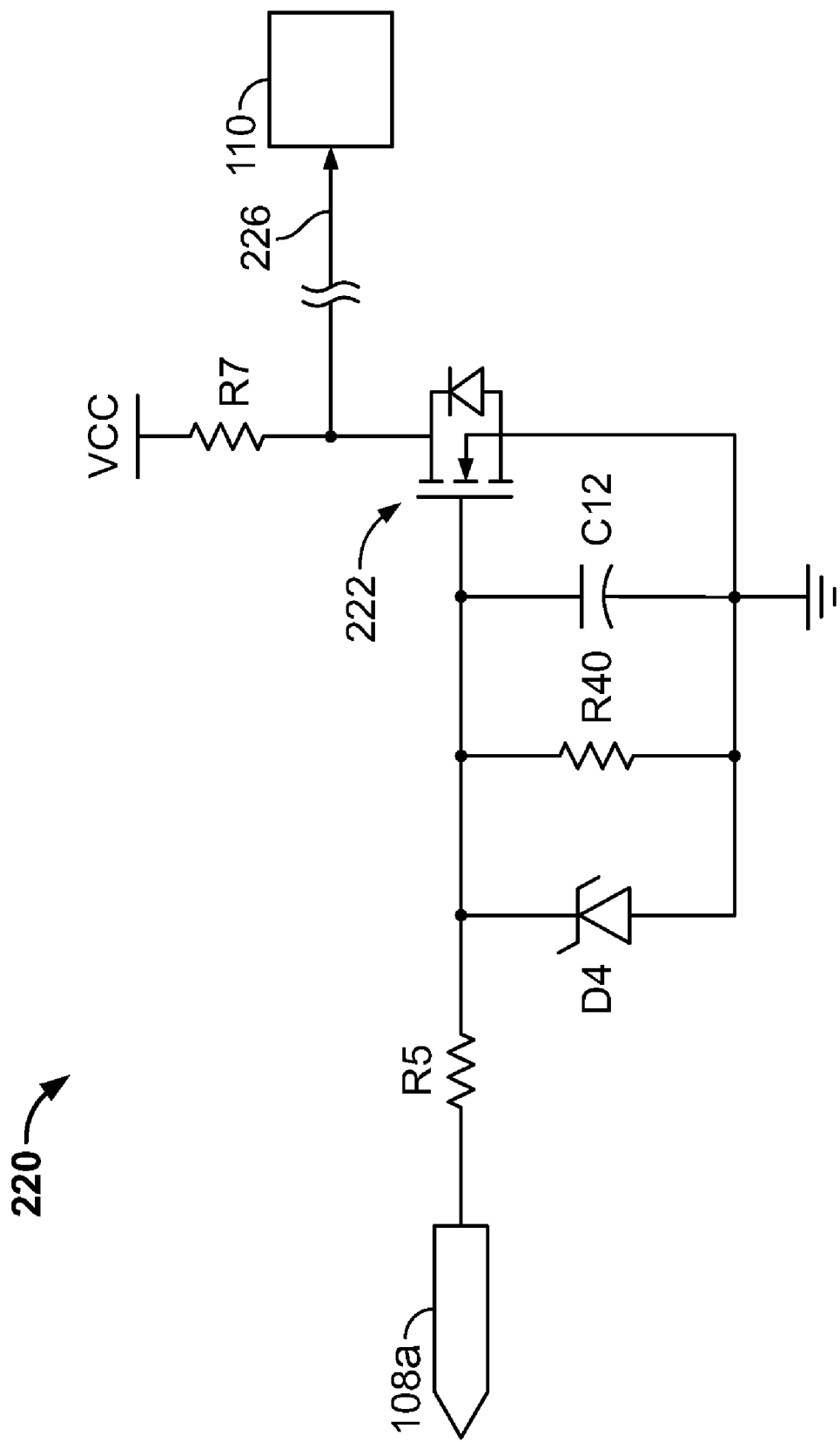
FIG. 2C is a circuit diagram of an electrode close circuit, which determines when the electrodes are touching and provides a corresponding signal indicative of whether the electrodes are touching.

FIG. 2C is a circuit diagram of an electrode close circuit 220, which determines when the electrodes 108 are touching one another and provides a signal 226 to the microcontroller 110 indicative of whether the electrodes 108 are touching one another or not. The electrode close circuit 220 is activated when the relay 132 is switched to the opposite position shown in FIG. 1. A 12V dc potential is provided across the electrodes 108 from the PCB 102, and the electrode close circuit 220 detects when the voltage on the stationary electrode 108*b* reaches 12V, indicating that the movable electrode 108*a* has made electrical contact with the stationary electrode 108*b*. A transistor 222 is turned on when its gate develops a voltage sufficient to cause the transistor 222 to conduct, causing the signal 226 to be pulled to ground, which is provided as an input to the microcontroller 110.

Figure 3:
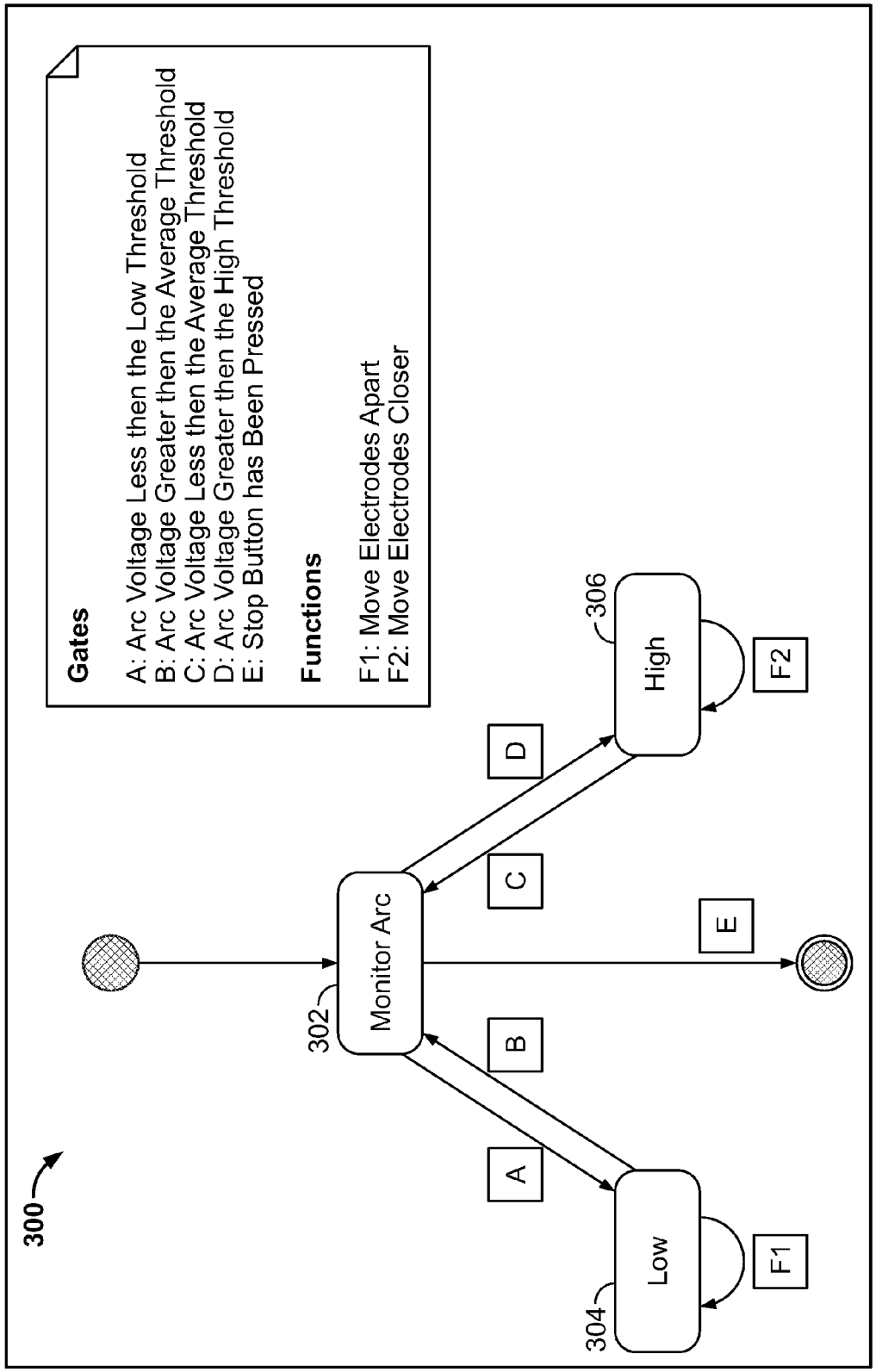
FIG. 3 is a Unified Modeling Language (UML) diagram of an algorithm for automatically maintaining a series arc by moving two electrodes relative to one another based upon an arc voltage across the electrodes.

FIG. 3 is a unified modeling language diagram of an algorithm 300 for automatically maintaining a series arc across the electrodes 108. Three states are shown, a "Monitor Arc" state 302, during which the electrodes 108 are not moved by the motor 104; a "Low" state 304, in which the arc voltage is less than a low voltage threshold; and a "High" state 306, in which the arc voltage exceeds a high voltage threshold. In all three states 302, 304, 306, the electrode voltage measurement circuit 200 continuously provides voltage measurements representing the voltage across the electrodes 108 to the A/D converter 126.

The algorithm 300 initializes to the Monitor Arc state 302. In this state, the electrodes remain stationary, and the electrode voltage measurement circuit 200 provides the voltage signal 206 to the A/D converter 126, which converts the voltage signal 206 to a digital value corresponding to the voltage of the arc present between the electrodes 108. If the arc voltage falls below a low voltage threshold, which in this example is 33V, the algorithm 300 transitions to the Low state 304 during which the microcontroller 110 instructs the motor 104 to cause the electrodes 108 to move apart by a predetermined number of steps. For example, the microcontroller 110 instructs the stepper motor 104 to rotate one step at a time (prior to taking another voltage measurement), which translates into approximately 2 μm of lateral movement of the movable electrodes 108a away from the stationary electrode 108b. If the measured arc voltage 108 then exceeds an average or medium voltage threshold, which in this example is 37V, the microcontroller 110 instructs the motor 104 to stop causing the electrodes 108 to move, and the algorithm 300 transitions back to the Monitor Arc 302 state.

If the arc voltage exceeds a high voltage threshold, which in this example is 41V, the algorithm 300 transitions to the High state 306. In the High state 306, the microcontroller 110 instructs the motor 104 to cause the movable electrode 108a to move closer to the stationary electrode 108b by a predetermined number of steps, which like the previous example, can be one step at a time. The microcontroller 110 continues to instruct the motor 104 to cause the electrodes 108 to move closer to one another while continuously monitoring the arc voltage via the voltage signal 206 from the electrode voltage measurement circuit 200. When the arc voltage monitored by the electrode voltage measurement circuit 200 then falls below the average or medium voltage threshold, which in this example is 37V, the algorithm 300 transitions back to the Monitor Arc state 302. If the operator presses the stop button 120b, the algorithm 300 ends and all voltage is removed from across the electrodes 108. Although the stepper motor 104 is moved one step at a time in this example, in other implementations, it can be moved more than one step at a time depending upon the latency associated with the time it takes the stepper motor to receive the instruction and actually cause the electrode 108a to move. Voltage readings from the measurement circuit 200 should be taken as frequently as possible to ensure that the electrodes are not moved away from each other or toward one another too quickly or too slowly such that the arc extinguishes or is not as visually "dramatic."

When the device 100 is initially powered on, the microcontroller 110 can first instruct the motor 104 to move the electrodes 108 closer together, while monitoring the voltage across them via the electrode close circuit 220. The relay 132 by default causes the electrode close circuit 220 to be activated. When the electrodes 108 are touching one another, the signal 226 provides an indication of this to the microcontroller 110, which instructs the motor 104 to stop moving the electrodes 108. Preferably, the microcontroller 110 can then instruct the motor 104 to move the electrodes 108 a predetermined distance away from each other, such as by 15 steps or corresponding to a gap of approximately 30 μm, so that when the operator pushes the start button 120a and places the device 100 into the arcing mode, arcs will very shortly thereafter be visible. By first moving the electrodes 108 back together until they touch, periodically or at the initiation of each test or demonstration, the present disclosure advantageously allows the electrodes to be used for multiple tests or demonstrations, even after their tips erode due to the cumulative destructive effects of extended arcing.

The following Table 1 presents exemplary values and part numbers for each of the listed components. These values and part numbers are exemplary only, and those of ordinary skill in the art to which this disclosure pertains will readily appreciate that other values or part numbers can be used without departing from the spirit and scope of this disclosure.

TABLE 1

| Component | Part Number/Value | Manufacturer |
| --- | --- | --- |
| stepper motor 104 | SAS 4004-010 | Hurst |
| relay 132 | KUHP-11DT1-12 | Potter & Brumfield |
| AFI circuit breaker 114 | QO120CAFI | Square D Company |
| display 122 | 20 characters × 4 lines | |
| R30 (FIG. 2A) | 499 kΩ | |
| R32 (FIG. 2A) | 499 kΩ | |
| R31 (FIG. 2A) | 20 kΩ | |
| D1/D2 (FIG. 2A) | BAV99W | |
| R1 (FIG. 2B) | 15 kΩ | |
| R3 (FIG. 2B) | 10.2 kΩ | |
| C9 (FIG. 2B) | 10 uF | |
| D2 (FIG. 2B) | MRA4003 | |
| optocoupler 214 (FIG. 2B) | PS2701 | NEC Electronics |
| R5 (FIG. 2C) | 10 kΩ | |
| R40 (FIG. 2C) | 100 kΩ | |
| C12 (FIG. 2C) | 10 nF (50 V) | |
| FET 222 (FIG. 2C) | NDS331 | Fairchild Semiconductor |
| R7 (FIG. 2C) | 10 kΩ | |

Although only one of the electrodes 108a is movable, in another implementation, both electrodes 108a,b can be movable under control of the stepper motor 104. The A/D converter 126 that converts the measured voltage across the electrodes 108 to a corresponding digital value can be external to the microcontroller 110.

Any of the algorithms (e.g., 300) include machine readable instructions for execution by: (a) a processor, (b) a controller, and/or (c) any other suitable processing device. It will be readily understood that the microcontroller 110 includes such a suitable processing device. Any algorithm disclosed herein may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

While particular aspects, embodiments, and applications of the present disclosure have been illustrated and described, it is to be understood that the disclosure is not limited to the precise construction and compositions disclosed herein and that various modifications, changes, and variations may be apparent from the foregoing descriptions without departing from the spirit and scope of the disclosure as defined in the appended claims.

What is claimed is:

1. An apparatus for generating a continuous series arc, comprising:
   a first electrode and a second electrode in series with a load connected across a circuit;
   a motor mechanically coupled to at least the first electrode;
   a controller that controls the motor to cause the first electrode to be urged toward or away from the second electrode under control of the motor, causing an electrical arc to be presented across a gap between the first electrode and the second electrode; and
   a switch for electrically connecting to the circuit at least a first circuit breaker configured to automatically detect series arc faults in the circuit; and
   a relay coupled to the electrodes and an electrode close circuit, the electrode close circuit including a transistor that turns on in response to the electrodes contacting one another to produce a signal to the controller indicating that the electrodes are contacting one another,
   wherein the controller is programmed to cause the motor to urge the first electrode away from the second electrode in response to the voltage of the electrical arc being less than a first voltage threshold and to cause the motor to urge the first electrode toward the second electrode in response to the voltage of the electrical arc exceeding a second voltage threshold that is greater than the first voltage threshold, and wherein the controller is further programmed to control the state of the relay such that when the relay is energized, the electrode close circuit is disconnected from the electrodes.

2. The apparatus of claim 1, further comprising an analog-to-digital converter configured to convert the voltage across the first and second electrodes to a corresponding digital value that represents the voltage of the electrical arc.

3. The apparatus of claim 1, wherein the controller is further programmed to, in response to the motor urging the first electrode away from the second electrode, cause the motor to stop in response to the voltage of the electrical arc being greater than a medium voltage threshold that is greater than the first voltage threshold but less than the second voltage threshold.

4. The apparatus of claim 3, wherein the controller is further programmed to, in response to the motor urging the first electrode toward the second electrode, cause the motor to stop in response to the voltage of the electrical arc being less than the medium voltage threshold.

5. The apparatus of claim 3, wherein the first voltage threshold is about 33 volts, the medium voltage threshold is about 37 volts, and the second voltage threshold is about 41 volts, and wherein a line voltage across the circuit is substantially 120 volts ac.

6. The apparatus of claim 1, wherein the motor is a stepper motor, and wherein the controller is programmed to cause the motor to move at least one step at a time before receiving another measurement of the voltage across the first and second electrodes.

7. The apparatus of claim 1, wherein the controller is further programmed to stop the motor in response to activation of a stop button.

8. The apparatus of claim 1, wherein the second electrode is movable under control of the motor.

9. The apparatus of claim 1, wherein the switch electrically connects the circuit to a second circuit breaker that is a thermal or thermal-magnetic circuit breaker, wherein the controller is further programmed to receive a first status signal from the first circuit breaker indicating a status of the first circuit breaker and to receive a second status signal from the second circuit breaker indicating a status of the second circuit breaker, wherein the status indicates at least an on or off state.

10. The apparatus of claim 1, wherein the controller is further programmed to cause the motor to urge the first electrode toward the second electrode until the controller receives the signal from the electrode close circuit indicating that the electrodes are contacting one another.

11. The apparatus of claim 10, wherein the controller is further programmed to, in response to receiving the signal from the electrode close circuit indicating that the electrodes are contacting one another, cause the motor to urge the first electrode away from the second electrode by a predetermined distance that causes an electrical arc to occur across the gap between the first and second electrode in response to a current being applied the electrodes.

12. An apparatus for generating a continuous series arc and maintaining the continuous series arc under control of a controller, comprising:
    a movable electrode and a stationary electrode in series with a load connected across a circuit;
    a motor coupled to the movable electrode;
    a controller that controls the motor to cause the movable electrode to move toward or away from the stationary electrode under control of the motor, causing an electrical arc to be presented across a gap between the movable electrode and the stationary electrode; and
    a switch for electrically connecting to the circuit one of at least two circuit breakers protecting the load against electrical faults, wherein one of the circuit breakers is a thermal or thermal-magnetic circuit breaker and another one of the circuit breakers is a circuit breaker configured to automatically detect series arc faults in the circuit; and
    a relay configured to electrically connect the electrodes to an electrode voltage measurement circuit or to an electrode close circuit,
    wherein the electrode voltage measurement circuit includes a voltage divider for ranging the voltage of the electrical arc to an analog-to-digital converter,
    wherein the electrode close circuit includes a transistor that turns on in response to the electrodes contacting one another to produce a signal to the controller indicating that the electrodes are contacting one another,
    wherein the controller is programmed to cause the motor to:
       move the movable electrode away from the stationary electrode in a first state,
       move the movable electrode toward the stationary electrode in a second state, and
       not move the movable electrode in a third state, wherein the first state, the second state, and the third state are mutually distinct, and
    wherein the controller is further programmed to control the state of the relay such that when the relay is energized, the electrode close circuit is disconnected from the electrodes.

13. The apparatus of claim 12, wherein the first state occurs in response to the voltage of the electrical arc being less than a first voltage threshold, and the second state occurs in response to the voltage of the electrical arc exceeding a second voltage threshold that is greater than the first voltage threshold.

14. The apparatus of claim 12, wherein the third state occurs in response to the voltage of the electrical arc being less than a medium voltage threshold that is greater than the first voltage threshold but less than the second voltage threshold or in response to the voltage of the electrical arc being greater than the medium voltage threshold.

15. The apparatus of claim 12, further comprising an analog-to-digital converter that converts the voltage measured across the stationary and movable electrodes to a corresponding digital value that represents the voltage of the electrical arc.

16. The apparatus of claim 12, wherein the motor is a stepper motor, and wherein the controller is programmed to cause the motor to move at least one step at a time before processing another measurement of the voltage across the electrodes.

17. The apparatus of claim 12, wherein the controller is further programmed to stop the motor in response to receiving an indication to stop the motor.

18. The apparatus of claim 12, wherein the controller is further programmed to:
   cause the motor to urge the movable electrode toward the stationary electrode until the controller receives the signal from the electrode close circuit indicating that the electrodes are contacting one another; and
   in response to receiving the signal from the electrode close circuit indicating that the electrodes are contacting one another, cause the motor to urge the movable electrode away from the stationary electrode by a predetermined distance that causes an electrical arc to appear across the gap between the electrodes in response to a current being supplied to the electrodes.

* * * * *